METHOD OF MANUFACTURING THIN-FILM INTEGRATED CIRCUITS

Filed Feb. 3, 1971

3 Sheets-Sheet 1

United States Patent Office 3,726,733
Patented Apr. 10, 1973

3,726,733
METHOD OF MANUFACTURING THIN-FILM INTEGRATED CIRCUITS

Masashi Nakamura, Tokyo, and Junichiro Yamazaki, Takeshi Kamo, and Shin Akiba, Kawasaki, Japan, assignors to Fujitsu Limited, Kawasaki, Japan Filed Feb. 3, 1971, Ser. No. 112,227
Claims priority, application Japan, Feb. 10, 1970, 45/11,584
Int. Cl. H01l 7/50
U.S. Cl. 156—17 3 Claims

ABSTRACT OF THE DISCLOSURE

A method of making a thin-film integrated circuit containing a tantalum nitride resistor and a tantalum capacitor is disclosed. A thin tantalum layer is provided on the upper surface of the tantalum nitride. This double layer is anodically oxidized in order to adjust the resistance value of the resistor. A tantalum pentoxide layer converted from the tantalum layer substantially protects the tantalum nitride from the etching liquid in the patterning of a tantalum layer for the formation of the tantalum capacitor deposited on the entire surface of the substrate subsequent to the formation of the resistor.

Our invention relates to a method of manufacturing a thin-film integrated circuit comprising a substrate, a resistor and a capacitor, said resistor and said capacitor being formed on said substrate by the use of tantalum compounds.

More particularly, our invention relates to a method of manufacturing a tantalum thin-film integrated circuit wherein the process is characterized by covering of the surface of a tantalum nitride with a tantalum pentoxide to protect the tantalum nitride from the etching liquid for etching a tantalum layer for the formation of a capacitor formed subsequent to the formation of the resistor.

According to the prior art, a hybrid circuit can be fabricated by the use of a passive film element of a thin film or a thick film and an active element such as a diode, a transistor or an IC chip. A passive film element of a high stability can be fabricated by the use of a tantalum compound. A tantalum pentoxide capacitor is disclosed in U.S. Pat. 2,993,266 and a tantalum nitride resistor is disclosed in U.S. Pat. 3,242,006. According to the prior art, the abovementioned hybrid circuit is formed by firstly forming a substrate provided with a single or a plurality of resistors separately from another substrate, provided with a single or a plurality of capacitors, and then coupling these two substrates. The two substrates must be first formed separately from each other because if the capacitors and resistors are formed on a single substrate, mutual interference occurs resulting in the deterioration of the characteristics and the lowering of the yield as a result of the characteristic deterioration. It was found that if a capacitor element is first formed on a substrate and a resistor element is then formed on the same substrate, the tantalum pentoxide layer, which is a dielectric, is affected by heat, ions having a high energy, the atmosphere generated in the deposition of a tantalum nitride as the resistor element and by an etching liquid for the patterning of the tantalum nitride. If, on the other hand, a resistor element is first formed on a substrate and a capacitor element is then formed on the same substrate, the tantalum nitride as the resistor element is etched by an etching liquid (a mixture of hydrofluoric acid and nitride acid) for the formation of the capacitor pattern.

In other prior art, on the other hand, the necessary tantalum and tantalum compound layers are continuously deposited and laminated on a single substrate and then the element is formed by the subsequent selective sequential etching. This integrated circuit containing multilayer tantalum compounds is disclosed in U.S. Pats. 3,387,952 and 3,406,043. In this integrated circuit, a parting layer of tantalum pentoxide or aluminum is necessary to avoid the simultaneous etching of the tantalum and tantalum nitride. Provision of a tantalum pentoxide layer, which is ordinarily an insulator in a conductive path, increases the circuit loss and deteriorates the high frequency characteristic while provision of an aluminum layer varies the characteristic of the integrated circuit and lowers the thermal stability of the integrated circuit due to the srongly oxidizing property and the low fusion point of aluminum. As is well known by those skilled in the art, the deposition of aluminum by evaporation is not easy and it is difficult to achieve the unification of the thickness of the film at a high degree.

From the viewpoint of the manufacturing technique, the manufacturing technique of tantalum capacitors and tantalum resistors is established so that we can consider it is desirable to fabricate a tantalum capacitor and a tantalum resistor sequentially eliminating the above-mentioned mutual interference and complete the desired tantalum thin-film circuit.

It is an object of our invention to provide a method of manufacturing tantalum thin-film integrated circuits of a high quality capable of sequentially fabricating a tantalum capacitor and a tantalum resistor on a single substrate.

Another object of this invention is to provide a method of manufacturing tantalum thin-film integrated circuits wherein the upper surface of a tantalum nitride is covered with tantalum pentoxide to protect the tantalum nitride from an etching liquid for etching a tantalum layer for the formation of a capacitor which is formed subsequently.

Other objects and effects of this invention will become evident from the following explanations of this invention.

According to this invention, in general, a resistor element of tantalum nitride is first formed on an insulating substrate and then a capacitor element is formed on the same substrate, the dielectric of said capacitor element being tantalum pentoxide. This will minimize the bad influence given where the capacitor element is formed previously. It has heretofore been believed that an oxide film formed by the anodic oxidation of tantalum nitride has a hydrofluoric acid resisting property but, as described above, and as will be described hereinbelow, in greater detail, such oxide film is also actually etched like tantalum nitride and it has been found that the higher the degree of nitriding of the tantalum nitride is, the higher the etching speed becomes.

As a first step for protecting the tantalum nitride from the etching liquid for etching tantalum, a thin tantalum layer is provided on at least the part of a conductive path having a resisting property of tantalum nitride that will not be covered by an electrode metal in the completed thin-film integrated circuit. This tantalum layer must have a thickness that can substantially prevent the variation of the resistance of the tantalum nitride in the etching of the tantalum layer for the formation of the capacitor and that will allow the execution of the anodic oxidation process described below and is preferably made of a thickness of 100–500 angstrom units. This protective tantalum layer is not required to cover the entire surface of the resisting conductive bath of tantalum nitride and can be formed close to the upper surface of the tantalum nitride. This is because the width of the resistor path is ordinarily above 50$\mu$ and the thickness thereof is of the order of 1000 angstrom units so that the erosion of the tantalum nitride in the lateral direction is negligible. Therefore the protective tantalum layer can be formed on the resisting conductive path of tantalum nitride with ease. A tantalum nitride layer is first formed on the entire surface of an insulating substrate by the well known cathode sputtering technique within an atmosphere containing nitrogen and a tantalum layer is then formed on the entire surface of said tantalum nitride layer close to the layer by the cathode sputtering within a pure argon atomsphere containing no nitrogen. This double layer is etched by the photoetching to form a resistor of a predetermined pattern. Tantalum and tantalum nitride can be etched by hydrofluoric nitric acid ($HF/HNO_3$).

As a second step for protecting tantalum nitride from the etching liquid for etching tantalum, the anodic oxidation is performed. A formation liquid is applied to the double layer on the insulating substrate to effect the anodic oxidation, the double layer being the anode and the formation liquid being the cathode. This anodic oxidation is continued until the overlying tantalum layer is completely oxidized and at least a part of the tantalum nitride layer is oxidized. The resistance value can be adjusted by the partial oxidation of the tantalum nitride. Therefore the resistance value of the predetermined pattern is always kept smaller than the desired value. The object of this anodic oxidation is to form a protective film covering the entire circumference of the tantalum nitride and also to adjust the resistance value. Therefore the overlying tantalum layer is completely oxidized. By this anodic oxidation, the overlying tantalum layer is converted into tantalum pentoxide. The side wall part of the tantalum nitride layer is also oxidized and this oxide and the overlying tantalum pentoxide protect the tantalum nitride from air. Thus, tantalum nitride is covered with a protective film for substantially protecting the tantalum nitride from the etching liquid for etching tantalum.

Next, according to this invention, a pure tantalum layer for the formation of a capacitor is formed. This pure tantalum layer can be formed by the above-mentioned well known cathode sputtering and can be formed on the entire surface of the substrate without the use of a mask. The substrate has a surface region on which the capacitor is to be formed, said surface being separate from the resistor portion fabricated previously. An etching resist is applied on at least the part of the pure tantalum layer above said surface region and then the substrate is dipped in an etching liquid. The etching liquid for etching tantalum is, as is well known, hydrofluoric nitric acid ($HF/NHO_3$) and this etching liquid etches and removes the part of the pure tantalum layer not covered with the resist. The tantalum layer deposited on the tantalum nitride resistor is also removed by this etching liquid but the upper surface of tantalum nitride is not etched as it is covered with tantalum pentoxide. The side wall part of tantalum nitride is covered with an oxide of the tantalum nitride and this oxide has no hydrofluoric acid resisting property but as the thickness of the tantalum nitride is, as described above, actually very small compared with the width thereof, the erosion of the tantalum nitride in the lateral direction is negligible. Thus, the tantalum layer for the formation of the capacitor can be selectively etched without substantially etching the tantalum nitride.

The tantalum layer left on said surface region is oxidized by the above-mentioned well known anodic oxidation treatment to form a tantalum pentoxide capacitor dielectric layer on the desired region. After the formation of the capacitor dielectric layer, a capacitor counterelectrode is attached to the dielectric layer and the capacitor is connected with the resistor by a conductive line of a metal film. The counterelectrode and the conductive line can be formed with a single metal film. A metal film with chemical stability and of a high electric conductivity such as gold is deposited on the entire surface of the substrate provided with a capacitor element and a resistor element and this metal film is etched by the photoetching to form the desired pattern.

Thus, an R-C integrated circuit can be manufactured. Where it is necessary, a monolithic semiconductor integrated circuit chip is bonded to this substrate to form a hybrid circuit. According to this invention, a plurality of tantalum capacitors and a plurality of tantalum resistors can be formed on a single substrate. Other characteristic features and effects of this invention will become evident from the following detailed explanation of the invention.

In the drawings:

FIG. 12 shows the relationship between the dipping time in hydrofluoric nitric acid and the resistance variation factor of the resistor element shown in FIG. 6.

Figure 1:
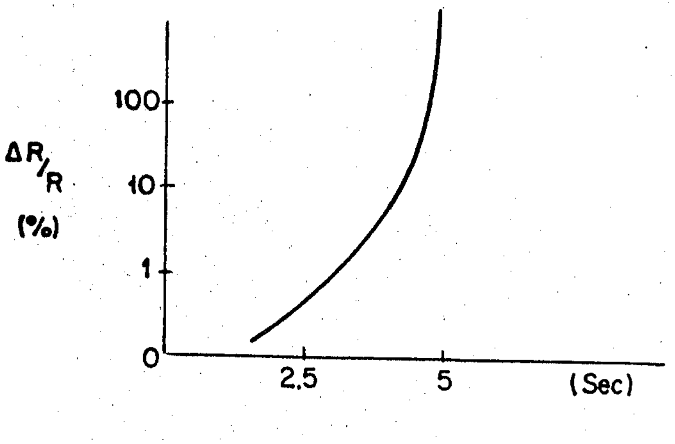
FIG. 1 shows the relationship between the dipping time in hydrofluoric nitric acid and the resistance variation factor of a conventional tantalum resistor having an oxide film of 500 A. made by anodically oxidizing a tantalum nitride layer of 1000 A. at 120 v.

Referring now to FIG. 1, resistance variation factor $\Delta R/R$ is the ratio between the initial resistance value and the difference between the initial resistance value and the resistance value exhibited after the dipping of the resistor in the etching liquid. As is evident from this diagram, the resistance value becomes infinite, i.e., the tantalum nitride is completely etched in about five seconds. It has been clarified by this that a formed film of tantalum nitride has no such hydrofluoric acid resisting property as heretofore been believed. Thus, according to the prior art, as the tantalum nitride resistor is etched by the etching liquid for etching the tantalum layer deposited on the resistor, it is substantially impossible to form the capacitor element subsequent to the formation of the resistor element.

Figure 2:
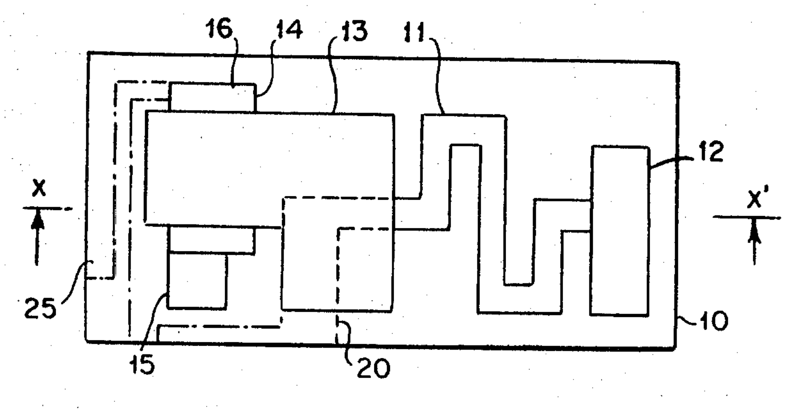
FIG. 2 is an above view of an embodiment of the R-C integrated circuit made by the method of this invention.

FIG. 2 is a top or plan view of the R-C-integrated circuit manufactured by the manufacturing process of FIGS. 3 to 12. The substrate 10 used in connection with this invention can be a flat sheet of glass, ceramic, etc., as is well known in the art, and forms no part of this invention. A glazed alumina ceramic is suited as the substrate 10 and the use of a glazed ceramic is also well known. It is noted that the substrate 10 must be properly cleaned to remove all organic contamination therefrom before being placed in a cathode sputtering device. A tantalum nitride resistor 11, having the surface protective film of tantalum pentoxide of this invention, has gold electrodes 12 and 13 at the two ends. Electrode 13 also operates as the counterelectrode of the tantalum capacitor 14 formed subsequently to the formation of resistor 11. Tantalum capacitor 14 comprises an electrode 15 of tantalum, a tantalum pentoxide capacitor dielectric 16 formed by the anodic oxidation of tantalum, and counterelectrode 13.

To simplify the explanation, FIGS. 3 to 12 show sectional views taken along the line X–X′ of the tantalum thin-film integrated circuit of FIG. 2.

Figure 3:
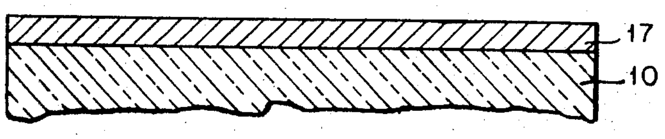
FIGS. 3 to 12 are sectional views of a coated substrate showing the process of making the R-C integrated circuit of FIG. 2.
Figure 4:
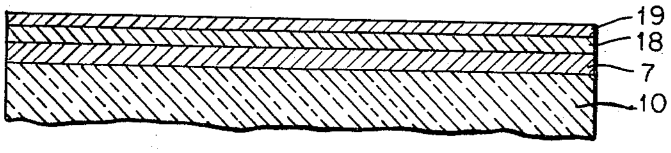

In FIG. 3, tantalum layer 17 is deposited on substrate 10 to a thickness of about 500 angstrom. This tantalum layer 17 is converted into tantalum pentoxide 7 by the heat treatment in the air at 500° C. for five hours. Substrate 10 is protected by this tantalum pentoxide layer from the etchant for etching the tantalum nitride for the formation of resistor paths. The purpose and function of a protective oxide layer on the substrate 10 is described in greater detail in U.S. Pat. No. 3,220,938. Protective oxide coated substrate 10 is then placed in, for example, a sputtering device and, as shown in FIG. 4, a tantalum nitride layer 18, with a thickness of 1000 angstrom, is deposited on the protective oxide layer by the reactive sputtering in an argon atmosphere, wherein the partial pressure of nitrogen is $5–20\times10^{-4}$ torr. A layer 19 of pure tantalum with a thickness of 300 angstrom is deposited on tantalum nitride layer 18 by the cathode sputtering in pure argon. Tantalum nitride layer 18 is ordinarily deposited to a thickness of 500–2000 angstrom. In this invention, the thickness of tantalum layer 19 is very important. If the tantalum layer is too thin, the protective function of tantalum pentoxide converted from the tantalum for protecting tantalum nitride in this invention becomes unsatisfactory. If the tantalum layer is too thick, on the other hand, it becomes impossible to anodically oxidize the tantalum layer completely. At least a part of the underlying tantalum nitride layer must also be oxidized so that the least upper limit of the thickness of tantalum layer 19 is 500 angstrom. The greatest lower limit of the thickness of tantalum layer 19 is 100 angstrom for the reason as described above. The most desirable thickness of the tantalum layer is 200–300 A.

Figure 5:
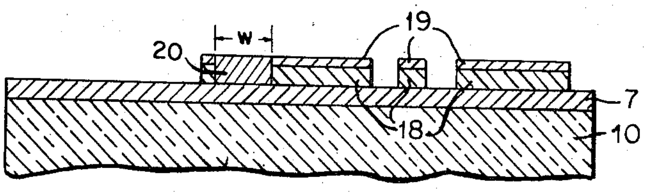
Figure 6:
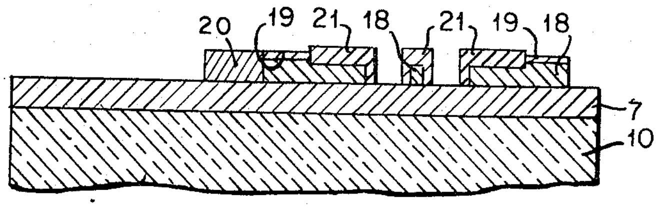

A conventional organic etching resist is coated on tantalum layer 19 along the predetermined pattern of the resistor paths. The substrate is dipped in hydrofluoric nitric acid (2 parts of 45% weight concentration HF and 5 parts of 60% weight concentration $HNO_3$) and the double layer of the tantalum layer and the tantalum nitride layer is etched to form the predetermined pattern as shown in FIG. 5. To facilitate the subsequent anodic oxidation treatment, it is advantageous to leave a conductive path 20 for the purpose of formation consisting of said double layer, one end of which is connected with the resistor path and the other end of which arrives at the peripheral part of the substrate. The anodic oxidation is performed to obtain a resistor path of a length that will give the desired resistance value. For this reason, the part of the double layer other than the part of a specific length and the most of conductive path 20 are covered with an organic resist. The part of conductive path 20 not covered with the resist is connected with the anode of the power source and the substrate is dipped in a 0.01% solution of citric acid in water. The formation liquid is connected with the cathode of the power source. The supply voltage is raised to 120 v. where the thickness of the tantalum layer is 300 angstrom. The depth of oxidation of the tantalum layer and the tantalum compound layer by the anodic oxidation treatment is determined by the formation voltage. A formation voltage of 120 v. can oxidize tantalum nitride layer 18. In this anodic oxidation treatment, the resistance value of the resistor is set to the desired value by the complete oxidation of tantalum layer 19 and the partial oxidation of tantalum nitride layer 18. The sectional view of the substrate on which the anodic oxidation treatment has been effected is shown in FIG. 6. Formed film 21, as described above, consists of the pentoxide of tantalum layer 19 and the oxide of tantalum nitride layer 18.

Figure 7:
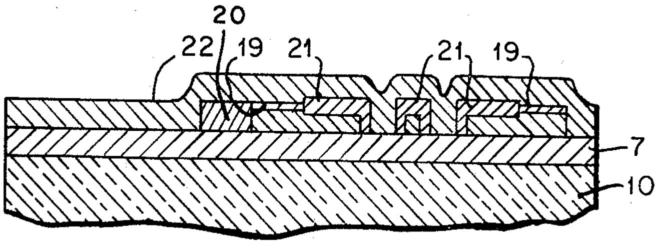
Figure 8:
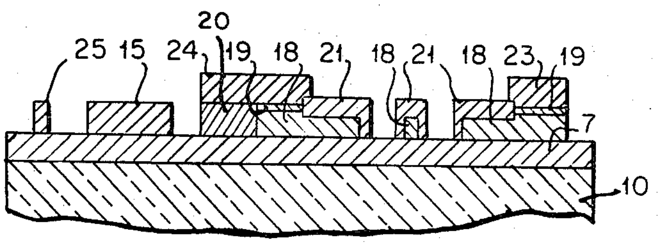

The substrate of FIG. 6 is placed in a sputtering device and, as shown in FIG. 7, tantalum layer 22 for the manufacture of the capacitor is deposited on the entire surface of the substrate. The thickness of this tantalum layer 22 is ordinarily made 5000 to 10,000 angstrom and in the present embodiment, the thickness is made 5000 angstrom. The tantalum layer 22 can be etched to form the desired pattern by the use of the abovementioned well known photo-etching art and, as shown in FIG. 8, tantalum is left on the surface region of the substrate on which capacitor 14 is to be formed. In the present embodiment, tantalum layers 23, 24 are also left on at least the unoxidized terminal parts of double layer out of the resistor path. Tantalum layers 23, 24 facilitate the leading out of the electrode to the resistor element and also prevents the disconnection due to the melting out of the electrode metal into the solder in the soldering of the resistor element to the electrode terminal. Furthermore, to facilitate the formation of the capacitor dielectric, it is advantageous to leave tantalum conductive path 25 for the purpose of the formation of the capacitor. One end of the path 25 is connected with the tantalum layer for the formation of the capacitor and the other end arrives at the peripheral part of the substrate. In this photo-etching, the abovementioned hydrofluoric nitric acid is used as the etching liquid and the tantalum on formed film 21 is etched and removed. Tantalum layer 22 of a thickness of 5000 angstrom can be completely removed by this etching liquid is about 45 seconds. During this etching time, the resistor is exposed for a very short period of time to a hydrofluoric nitric acid which etches the tantalum nitride layer as well but which is not substantially influenced by the acid.

Figure 13:
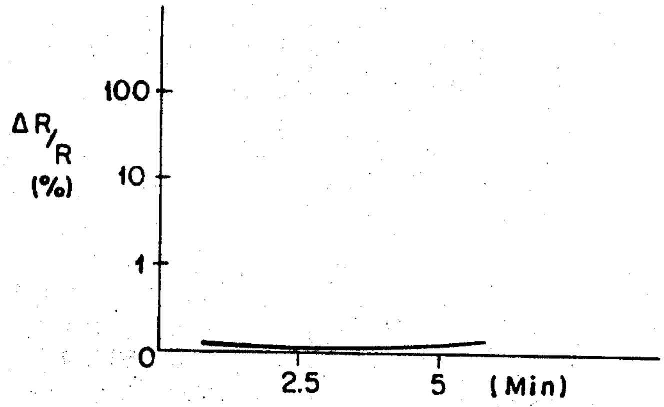

This is evident from FIG. 13 showing the relation between the dipping time in a hydrofluoric acid and the resistance variation factor of the resistor of FIG. 6 wherein the part other than formed film 21 is covered with an etching resist. It also becomes evident from FIG. 13 that the resistor can be satisfactorily protected from the etching liquid by tantalum pentoxide converted from tantalum deposited on only the upper surface of tantalum nitride. Thus, the protective tantalum pentoxide layer can be formed with great ease by depositing tantalum nitride on the substrate, depositing tantalum on tantalum nitride and then anodically oxidizing the substrate, said anodic oxidation treatment also operating to adjust the resistance value of the tantalum nitride resistor. Therefore, the resistance value of the resistor is scarcely varied in the patterning of tantalum layer 22.

Figure 9:
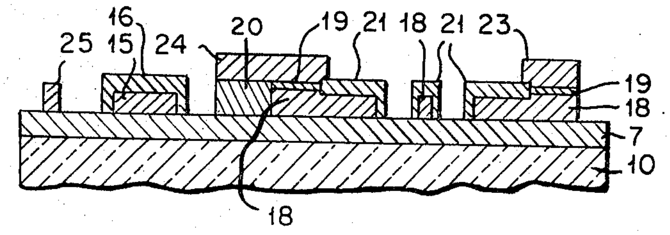

With the purpose to form the capacitor dielectrics 16, tantalum 15 is selectively covered with a resist. The anodic oxidation is performed in the same manner as the anodic oxidation of the resistor. The formation voltage is made 200–300 v. By this anodic oxidation, tantalum pentoxide dielectric 16 of 3000–5000 angstrom is formed as shown in FIG. 9.

Figure 10:
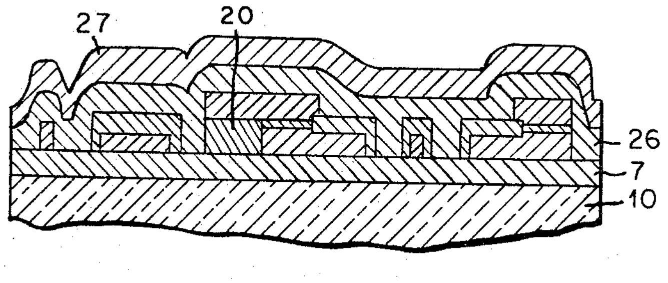
Figure 11:
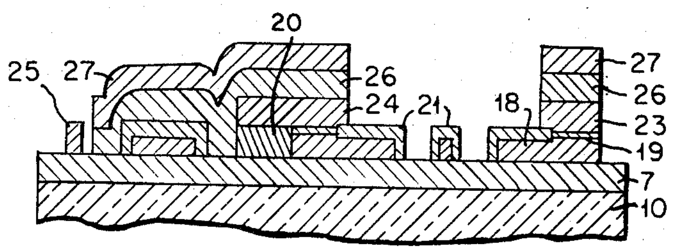
Figure 12:
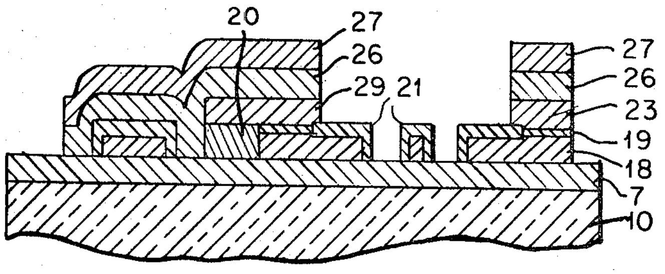

To form capacitor counterelectrode 13 and electrode 12 (see FIG. 2) the substrate is placed in a vacuum evaporation device and, as shown in FIG. 10, nickel-chromium alloy layer 26 is formed to a thickness of 200–1000 angstrom and gold layer 27 is deposited on the alloy layer to a thickness of 3000–5000 angstrom. A titanium layer can be substituted for the nickel-chromium alloy layer 26. The patterning of the electrodes can be performed by the photo-etching. A solution of iodine and potassium iodide in water can be used for the etching of gold and hydrochloric acid or a solution of ceric sulfate and nitric acid in water can be used for the etching of the nickel-chromium alloy. A sectional view of the substrate on which electrodes 12 and 13 have been formed is shown in FIG. 11. As the last etching process, conductive paths 20 and 25, for the purpose of formation, are selectively etched and removed by the use of a hydrofluoric-nitric acid. A sectional view of the substrate on which the formation of the R-C circuit has been completed is shown in FIG. 12.

In a film device, annealing is particularly important and by the annealing treatment the stabilization of the characteristics of the resistor and capacitor can be achieved. Annealing under a low temperature cannot make the resistance characteristic satisfactory and annealing under a high temperature makes the capacitance characteristic unsatisfactory. The optimum heat treatment temperature resides between 200° C. and 250° C. and the optimum heat treatment time is of the order of several hours.

While there has been described, in connection with the preferred embodiment of this invention, various changes and modifications may be made therein without departing from the spirit of this invention described in the claims and all such changes and modifications are included in this invention.

We claim:

1. A method of manufacturing thin-film integrated circuits comprising the steps of forming a tantalum nitride layer on an insulating substrate, forming a first tantalum layer close to said tantalum nitride layer, selectively etching and removing said tantalum nitride layer and said first tantalum layer to form a predetermined pattern to form resistor paths, anodically oxidizing a part of said resistor paths, said first tantalum layer being completely oxidized and at least a part of said tantalum nitride layer being also oxidized through said first tantalum layer, forming a second tantalum layer on the entire surface of said substrate, and selectively etching said second tantalum layer by a photo-etching treatment to leave a tantalum layer on one surface region of said substrate separate from the surface region on which said resistor paths are formed.

2. A method of manufacturing thin-film integrated circuits comprising the steps of forming a tantalum nitride layer on an insulating substrate, forming a first tantalum layer close to said tantalum nitride layer, selectively etching and removing said tantalum nitride layer and said first tantalum layer to form a predetermined pattern to form resistor paths, anodically oxidizing at least a part of said resistor paths, said first tantalum layer being completely oxidized, at least a part of said tantalum nitride layer being also oxidized through said first tantalum layer and the resistance value of the resistor being adjusted by said anodic oxidation, depositing a second tantalum layer on the entire surface of said substrate, and selectively etching said second tantalum layer by a photo-etching treatment to leave the tantalum layer only on one surface region of the substrate separate from the surface region on which said resistor paths are formed and on the terminal parts at the two ends of said resistor paths.

3. A method of manufacturing thin-film integrated circuits comprising the steps of forming a tantalum nitride layer on an insulating substrate, forming a first tantalum layer close to said tantalum nitride layer, selectively etching and removing said tantalum nitride layer, selectively etching and removing said tantalum nitride layer and said first tantalum layer to form a predetermined pattern to form resistor paths and first conductive path for the purpose of the formation treatment one end of which is connected with said resistor paths and the other end of which is arriving at the peripheral part of said substrate, anodically oxidizing at least a part of said resistor paths by dipping said substrate in a formation liquid and supplying a current through said first conductive path for the purpose of the formation treatment, said first tantalum layer being completely oxidized, at least a part of said tantalum nitride layer being also oxidized through said first tantalum layer and the resistance value of the resistor being adjusted by said anodic oxidation, depositing a second tantalum layer on the entire surface of said substrate, selectively etching said second tantalum layer by a photo-etching treatment by the use of a hydrofluoric nitric acid to leave the tantalum layer on one surface region of said substrate on which the capacitor is to be formed and on the part of said resistor paths not oxidized and also to form a second conductive path for the purpose of the formation treatment one end of which is connected with the tantalum layer for the formation of the capacitor and the other end of which is arriving at the peripheral part of said substrate, forming a capacitor dielectric layer on one surface of said tantalum layer for the formation of the capacitor by dipping said substrate in a formation liquid and supplying a current through said second conductive path for the purpose of the formation treatment, forming a capacitor counterelectrode, and depositing an electrode metal on the part of said resistor not oxidized to form a terminal electrode.

References Cited

UNITED STATES PATENTS

| | | | |
|---|---|---|---|
| 3,489,656 | 1/1970 | Balde | 204—15 |
| 3,607,679 | 9/1971 | Melroy | 204—15 |

JACOB H. STEINBERG, Primary Examiner

U.S. Cl. X.R.

29—580; 156—11